United States Patent
Tisinger

(10) Patent No.: US 8,344,779 B2
(45) Date of Patent: Jan. 1, 2013

(54) COMPARATOR CIRCUIT WITH HYSTERESIS, TEST CIRCUIT, AND METHOD FOR TESTING

(75) Inventor: Eric W. Tisinger, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 227 days.

(21) Appl. No.: 12/871,597

(22) Filed: Aug. 30, 2010

(65) Prior Publication Data

US 2012/0049891 A1 Mar. 1, 2012

(51) Int. Cl.
*H03K 3/00* (2006.01)

(52) U.S. Cl. .............. 327/205; 327/206; 327/307

(58) Field of Classification Search .............. 327/205, 327/206, 307
See application file for complete search history.

(56) References Cited

U.S. PATENT DOCUMENTS

| | | | |
|---|---|---|---|
| 5,450,417 A | 9/1995 | Truong et al. | |
| 5,936,448 A | 8/1999 | Ohie et al. | |
| 6,127,898 A | 10/2000 | Naura | |
| 6,140,872 A * | 10/2000 | McEldowney | 330/9 |
| 6,208,187 B1 | 3/2001 | Callahan, Jr. | |
| 6,549,048 B2 | 4/2003 | Tailliet | |
| 6,798,250 B1 | 9/2004 | Wile | |
| 6,870,413 B1 | 3/2005 | Chang et al. | |
| 7,046,014 B2 | 5/2006 | Lu | |
| 7,404,119 B2 | 7/2008 | Hsieh | |
| 7,519,486 B2 | 4/2009 | Ng et al. | |
| 2007/0216397 A1 | 9/2007 | Chan et al. | |
| 2008/0265931 A1 | 10/2008 | Hsu et al. | |

OTHER PUBLICATIONS

U.S. Appl. No. 12/871,589, Belser, M.A., et al., "Schmitt Trigger with Test Circuit and Method for Testing", filed Aug. 30, 2010, Office Action—Rejection, mailed Nov. 28, 2011.
U.S. Appl. No. 12/871,589, Belser, M.A., et al., "Schmitt Trigger with Test Circuit and Method for Testing", filed Aug. 30, 2010, Office Action—Notice of Allowance, mailed May 29, 2012.

* cited by examiner

*Primary Examiner* — Kenneth B. Wells
(74) *Attorney, Agent, or Firm* — Daniel D. Hill

(57) ABSTRACT

A comparator has a first input, a second input, an output, a control electrode of a first hysteresis transistor coupled to the output, and a control electrode of a second hysteresis transistor coupled to the output. A method for testing the comparator includes: reconfiguring the comparator to be an amplifier with unity gain feedback; providing an input voltage to the input; providing a first voltage to the first hysteresis transistor to provide a first offset voltage; measuring a first output voltage at the output; removing the first voltage from the first hysteresis transistor; providing the first voltage to the second hysteresis transistor; and measuring a second output voltage at the output.

20 Claims, 3 Drawing Sheets

COMPARATOR CIRCUIT WITH HYSTERESIS, TEST CIRCUIT, AND METHOD FOR TESTING

RELATED APPLICATION

The present application is related to a commonly assigned, co-pending application Ser. No. 12/871,589 by Belser et al. entitled, "Schmitt Trigger with Test Circuit and Method For Testing", and filed concurrently herewith.

BACKGROUND

1. Field

This disclosure relates generally to comparators, and more specifically, to a test circuit and method for testing a comparator with hysteresis.

2. Related Art

Comparator circuits are used in a variety of applications. A comparator with hysteresis is commonly used as a power-on-reset (POR) circuit. Testing the high and low switching threshold voltages of the comparator with hysteresis generally includes slowly ramping the input voltage up and then down and measuring when the output voltage changes. However, testing the hysteresis threshold switching voltages in this way requires a significant amount of time.

Therefore, what is needed is a comparator test circuit and method for testing that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
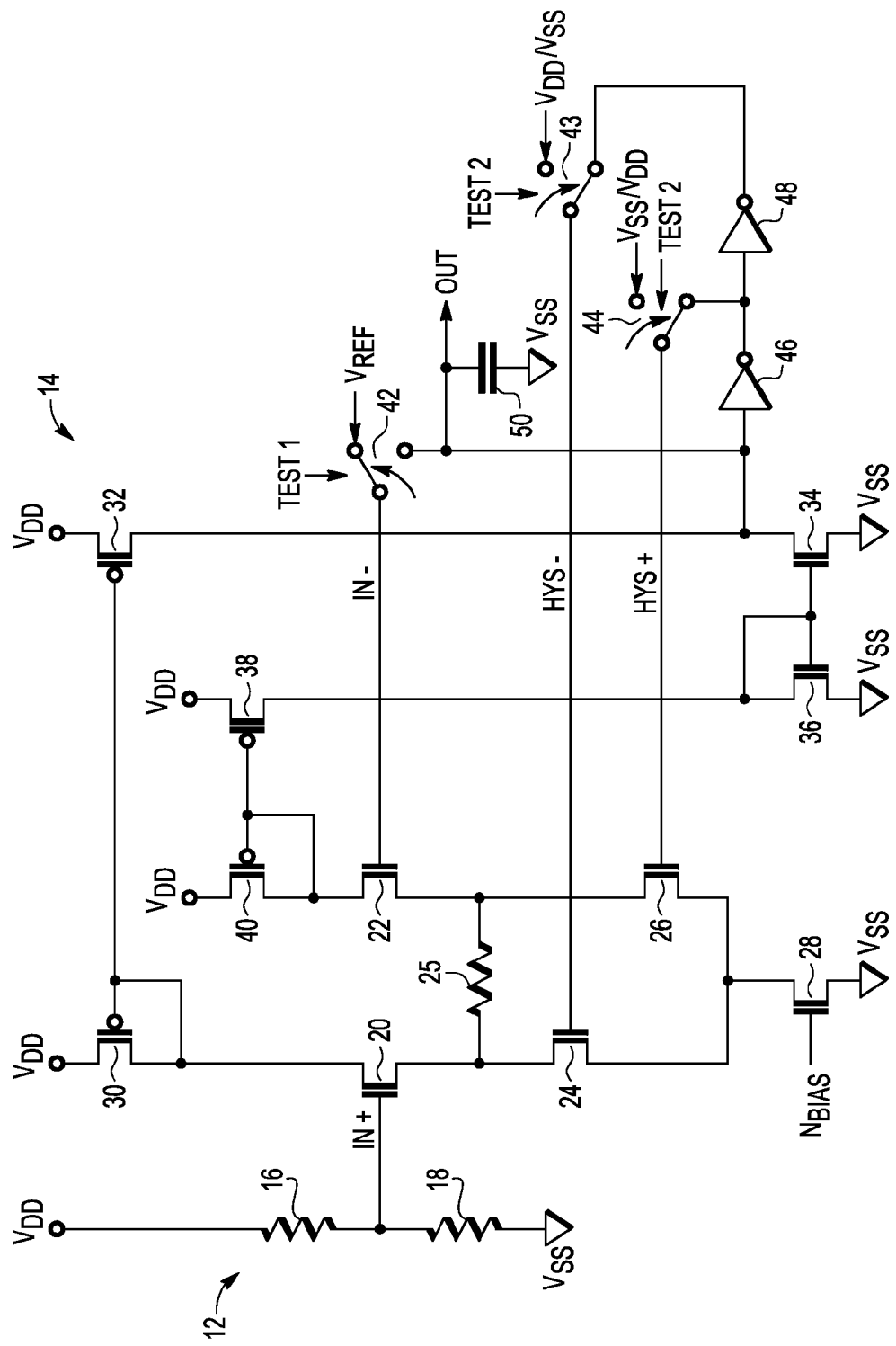
FIG. 1 illustrates, in schematic diagram form, a comparator with hysteresis and test circuit in accordance with an embodiment.

Generally, there is provided, a test circuit and method for testing a comparator having hysteresis. The comparator comprises first and second input transistors and first and second hysteresis transistors. In a power-on-reset (POR) application, the first input transistor is coupled to receive an input voltage representative of a power supply voltage, and the second input is coupled to receive a reference voltage. Gates of the first and second hysteresis transistors are coupled to an output of the comparator to provide a feedback path for normal operation. A hysteresis test circuit comprises first and second switches placed in the hysteresis feedback path to decouple the feedback path. Also, a third switch is provided to selectively couple the gate of the second transistor to an output of the comparator. This effectively reconfigures the comparator as an amplifier having unity gain feedback with one of either positive offset or negative offset. The output of the amplifier provides a voltage that can be correlated to the high and low threshold voltages when the circuit is configured as a comparator. To test the high hysteresis threshold voltage, a power supply voltage is provided to the gate of the first hysteresis transistor, the gate of the second hysteresis transistor is coupled to ground, and the third switch couples the output of the comparator to the gate of the second transistor. A voltage at the output is equal to the high hysteresis threshold voltage. To test the low hysteresis threshold voltage, the power supply voltage is provided to the gate of the second hysteresis transistor, the gate of the first hysteresis transistor is coupled to ground, and the third switch couples the output of the comparator to the gate of the second transistor. A voltage at the output of the comparator is equal to the low hysteresis threshold voltage. Testing the hysteresis threshold voltages using this technique eliminates the need to ramp the input voltage and therefore provides a faster technique to measure the high and low hysteresis voltages.

In one aspect, there is provided, in a comparator having a first input, a second input, an output, a first hysteresis transistor having a control electrode coupled to the output, and a second hysteresis transistor having a control electrode coupled to the output, a method for testing the comparator, the method comprising: reconfiguring the comparator to be an amplifier with unity gain feedback; providing an input voltage to the input; providing a first voltage to the first hysteresis transistor to provide a first offset voltage; measuring a first output voltage at the output; removing the first voltage from the first hysteresis transistor; providing the first voltage to the second hysteresis transistor; and measuring a second output voltage at the output. Reconfiguring the comparator further comprises: decoupling the control electrode of the first hysteresis transistor from the output; decoupling the control electrode of the second hysteresis transistor from the output; and coupling the second input to the output. Providing the first voltage to the first hysteresis transistor may further comprise providing a second voltage to the second hysteresis transistor, wherein the second voltage is different than the first voltage. The first voltage may be characterized as being a positive power supply voltage and the second voltage is zero volts. Providing the first voltage to the second hysteresis transistor may further comprise providing a second voltage to the first hysteresis transistor, wherein the second voltage may be different than the first voltage. Providing the input voltage to the input may further comprise providing the input voltage from a voltage divider coupled between first and second power supply voltage terminals. The comparator may be used in a power-on-reset application. The method may further comprise coupling a compensation capacitor between the output and ground.

In another aspect, there is provided, in a comparator circuit having a first input transistor having a control electrode for receiving an input voltage, a second input transistor having a control electrode for receiving a reference voltage, a current mirror having an input coupled to a second current electrode of the first input transistor, the current mirror having an output, a first hysteresis transistor having a first current electrode coupled to a first current electrode of the first input transistor, a second hysteresis transistor having a first current electrode coupled to a first current electrode of the second input transistor, a control electrode of each of the first and second hysteresis transistors selectively coupled to the output, a method for testing the comparator, the method comprising: decoupling the control electrodes of the first and second hysteresis transistors from the output; coupling the control electrode of the second input transistor to the output of the current mirror; providing a first power supply voltage to the control electrode of the first hysteresis transistor; providing a second power supply voltage to the control electrode of the second hysteresis transistor, the second power supply voltage being different than the first power supply voltage; providing an input voltage to the control electrode of the first input transistor; measuring a first output voltage at the output of the current mirror; providing the second power supply voltage to the control electrode of the first hysteresis transistor; providing the first power supply voltage to the control electrode of the second hysteresis transistor; and measuring a second output voltage at the output of the current mirror. The comparator may be used in a power-on-reset circuit. The first power supply voltage may be a positive power supply voltage and the second power supply voltage may be zero volts. Measuring the first output voltage may further comprise measuring a high hysteresis threshold voltage of the comparator, wherein measuring the second output voltage may further comprise measuring a low hysteresis threshold voltage of the comparator. The method may further comprise coupling a compensation capacitor between the output of the current mirror and a power supply voltage terminal. Providing the input voltage to the control electrode of the first input transistor may further comprise providing the input voltage from a voltage divider coupled between first and second power supply voltage terminals.

In yet another aspect, there is provided, a comparator comprising: a first input transistor having a first current electrode, a second current electrode, and a control electrode for receiving a first input voltage; a second input transistor having first current electrode, a second current electrode, and a control electrode for receiving a second input voltage; a current mirror having an input terminal coupled to the first current electrode of the first input transistor, and an output terminal; a first hysteresis transistor having a first current electrode coupled to the second current electrode of the first input transistor, a second current electrode, and a control electrode; a second hysteresis transistor having a first current electrode coupled to the second current electrode of the second input transistor, a second current electrode, and a control electrode; a first switch having a first terminal coupled to the control electrode of the second input transistor, and a second terminal coupled to the output terminal of the current mirror; a second switch coupled between the control electrode of the first hysteresis transistor and one of either a power supply voltage or a first output voltage from the current mirror; and a third switch coupled between the control electrode of the second hysteresis transistor and one of either the power supply voltage or a second output voltage from the current mirror. The comparator may further comprise a resistive element having a first terminal coupled to the second current electrode of the first input transistor and a second terminal coupled to the second current electrode of the second input transistor. The comparator may further comprise a voltage divider coupled to the control electrode of the first input transistor for providing the first input voltage. The comparator may further comprise an inverter coupled between the output terminal of the current mirror and a terminal of the third switch. The comparator may further comprise a current source having a first terminal coupled to the second current electrodes of the first and second hysteresis transistors, and a second terminal coupled to a power supply voltage terminal. The current mirror may comprise: a first transistor having a first current electrode coupled to a first power supply voltage terminal, and a control electrode and a second current electrode both coupled to the first current electrode of the first input transistor; a second transistor having a first current electrode coupled to the first power supply voltage terminal, a second current electrode, and a control electrode coupled to the first current electrode of the first input transistor; a third transistor having a first current electrode coupled to the second current electrode of the second transistor, a second current electrode coupled to a second power supply voltage terminal, and a control electrode; a fourth transistor having a first current electrode and control electrode both coupled to the control electrode of the third transistor, and a second current electrode coupled to the second power supply voltage terminal; a fifth transistor having a first current electrode coupled to the first power supply voltage terminal, a control electrode coupled to the first current electrode of the second input transistor, and a second current electrode coupled to the first current electrode of the fourth transistor; and a sixth transistor having a first current electrode coupled to the first power supply voltage terminal, a control electrode and a second current electrode both coupled to the first current electrode of the second input transistor.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

Each signal described herein may be designed as positive or negative logic, where negative logic can be indicated by a bar over the signal name or the letter "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in schematic diagram form, comparator with hysteresis and test circuit 10 in accordance with an embodiment. Comparator 10 includes voltage divider 12, current mirror circuit 14, first input transistor 20, second input transistor 22, first hysteresis transistor 24, second hysteresis transistor 26, resistor 25, current source 28, switches 42, 43, and 44, inverters 46 and 48, and compensation capacitor 50. Voltage divider 12 includes resistors 16 and 18. Current mirror circuit 14 includes P-channel transistors 30, 32, 38, and 40, and N-channel transistors 34 and 36. In the illustrated embodiment, current mirror circuit 14 includes three current mirrors. Each of transistors 20, 22, 24, 26, and 28 are N-channel transistors in the illustrated embodiment. In one embodiment, comparator 10 is implemented in a conventional CMOS (complementary metal-oxide semiconductor) process on an integrated circuit and used in a power-on-reset (POR) application. In another embodiment, comparator 10 can be used for a different purpose and implemented using a different manufacturing process technology.

In voltage divider 12, resistor 16 has a first terminal connected to a power supply voltage terminal labeled "VDD", and a second terminal. Resistor 18 has a first terminal connected to the second terminal of resistor 16, and a second terminal connected to a power supply voltage terminal labeled "VSS". In the illustrated embodiment, resistors 16 and 18 are polysilicon resistors. In another embodiment, resistors 16 and 18 may be any kind of passive or active resistive elements for providing a voltage divider function. Also, in the illustrated embodiment, VDD is for receiving a positive power supply voltage and VSS is coupled to ground (zero volts). In another embodiment, a different power supply voltage can be used.

In current mirror 14, P-channel transistor 30 has a source (current electrode) connected to VDD, and a drain (current electrode) and gate (control electrode) connected together to form an input of current mirror 14. P-channel transistor 32 has a source connected to VDD, a drain connected to an output terminal labeled "OUT", and a gate connected to the gate and drain of P-channel transistor 30. The drain of transistor 30 and the gates of transistors 30 and 32 together function as an input of current mirror circuit 14. Likewise, the gates of transistors 38 and 40 and the drain of transistor 40 function as another input of current mirror circuit 14. N-channel transistor 34 has a drain connected to the drain of P-channel transistor 32, a source connected to VSS, and a gate. N-channel transistor 36 has a source connected to VSS, and a gate and drain both connected to the gate of N-channel transistor 34. P-channel transistor 38 has a source connected to VDD, a gate, and a drain connected to the drain of N-channel transistor 36. P-channel transistor 40 has a source connected to VDD, and a gate and drain both connected to the gate of P-channel transistor 38.

Input transistor 20 has a drain connected to an input of current mirror 14, a gate connected to the second terminal of resistor 16 for receiving input voltage IN+, and a source. Input transistor 22 has a drain connected to the drain and gate of transistor 40 (an input of current mirror 14), a gate for receiving an input voltage labeled "IN−", and a source. Resistor 25 has a first terminal connected to the source of transistor 20, and a second terminal connected to the source of transistor 22. Hysteresis transistor 24 has a drain connected to the source of transistor 20, a gate for receiving a voltage labeled "HYS−", and a source. Hysteresis transistor 26 has a drain connected to the source of transistor 22, a gate for receiving a voltage labeled "HYS+", and a source connected to the source of transistor 24. Transistor 28 has a drain connected to the sources of both transistors 24 and 26, a gate for receiving a bias voltage labeled "NBIAS", and a source connected to VSS. Inverter 46 has an input connected to output terminal OUT, and an output terminal. Inverter 48 has an input connected to the output of inverter 46, and an output. In the illustrated embodiment, compensation capacitor 50 has a first plate electrode connected to output OUT, and a second plate electrode connected to VSS. Compensation capacitor 50 may be needed in some embodiments to prevent oscillation.

Switch 42 has a first terminal connected to the gate of input transistor 22, a second terminal coupled to receive a reference voltage labeled "VREF", and a third terminal connected to output terminal OUT. Switch 42 is responsive to a signal labeled "TEST1". Switch 43 has a first terminal connected to the gate of transistor 24, a second terminal coupled to one of power supply voltages VDD or VSS, and a third terminal connected to the output of inverter 48. Switch 44 has a first terminal connected to the gate of transistor 26, a second terminal coupled to one of power supply voltage VSS or VDD, and a third terminal connected to the output of inverter 46. Switches 43 and 44 are each responsive to a signal labeled "TEST2". Switches 42-44 are illustrated as dipole switches for the purposes of simplicity and clarity. There are a number of ways to implement switches 42-44. For example, in one embodiment, switches 42-44 may each be implemented using one or more MOS transistors.

In FIG. 1, switches 42, 43, and 44 are illustrated in the positions necessary for normal operation of comparator 10. That is, as illustrated, signals TEST1 and TEST2 are provided to cause switch 42 to connect reference voltage VREF to the gate of transistor 22, to cause switch 43 to connect the output of inverter 48 to the gate of hysteresis transistor 24, and to cause switch 44 is connect the output of inverter 46 to the gate of hysteresis transistor 26.

In normal operation comparator 10 compares input signal IN+ to the input signal IN−. Generally, if input signal IN+ is at a higher voltage level than a voltage level of input signal IN− (VREF), more current is steered through transistor 20 than through transistor 22 pulling the gates of P-channel transistors 30 and 32 lower than the gates of P-channel transistors 38 and 40. N-channel transistors 34 and 36 become less conductive. A current through transistor 30 is mirrored by transistor 32, and a voltage at output OUT is pulled high. The high voltage OUT is fed back through inverters 46 and 48 to hysteresis transistors 24 and 26 causing transistor 24 to be more conductive than transistor 26. The resistance value of resistor 25 sets a hysteresis voltage offset between the IN+ and the IN− sides of comparator 10. For example, if the voltage of input IN+ changes so that input signal IN− is higher than input signal IN+, more current begins to be steered through transistor 22 than through transistor 20. Resistor 25 sets a voltage differential between the sources of transistors 20 and 22 so that the switch point of the voltage at output OUT is delayed until the voltage at the source of transistor 22 increases above the voltage differential provided by resistor 25. The voltage at output OUT changes to a logic low, and transistor 24 becomes substantially non-conductive while transistor 26 becomes conductive.

In a POR application, input signal IN+ is provided as a function of the power supply voltage. The level of the power supply voltage at voltage divider 12 determines the logic state of output OUT. When the power supply voltage is at or above a correct level for proper operation of the integrated circuit, comparator 10 asserts OUT at one logic level. Output OUT is negated to prevent operation of the integrated circuit when the power supply voltage is below the correct voltage level. Therefore, it is important that comparator 10 sense the power supply voltage level accurately.

Figure 2:
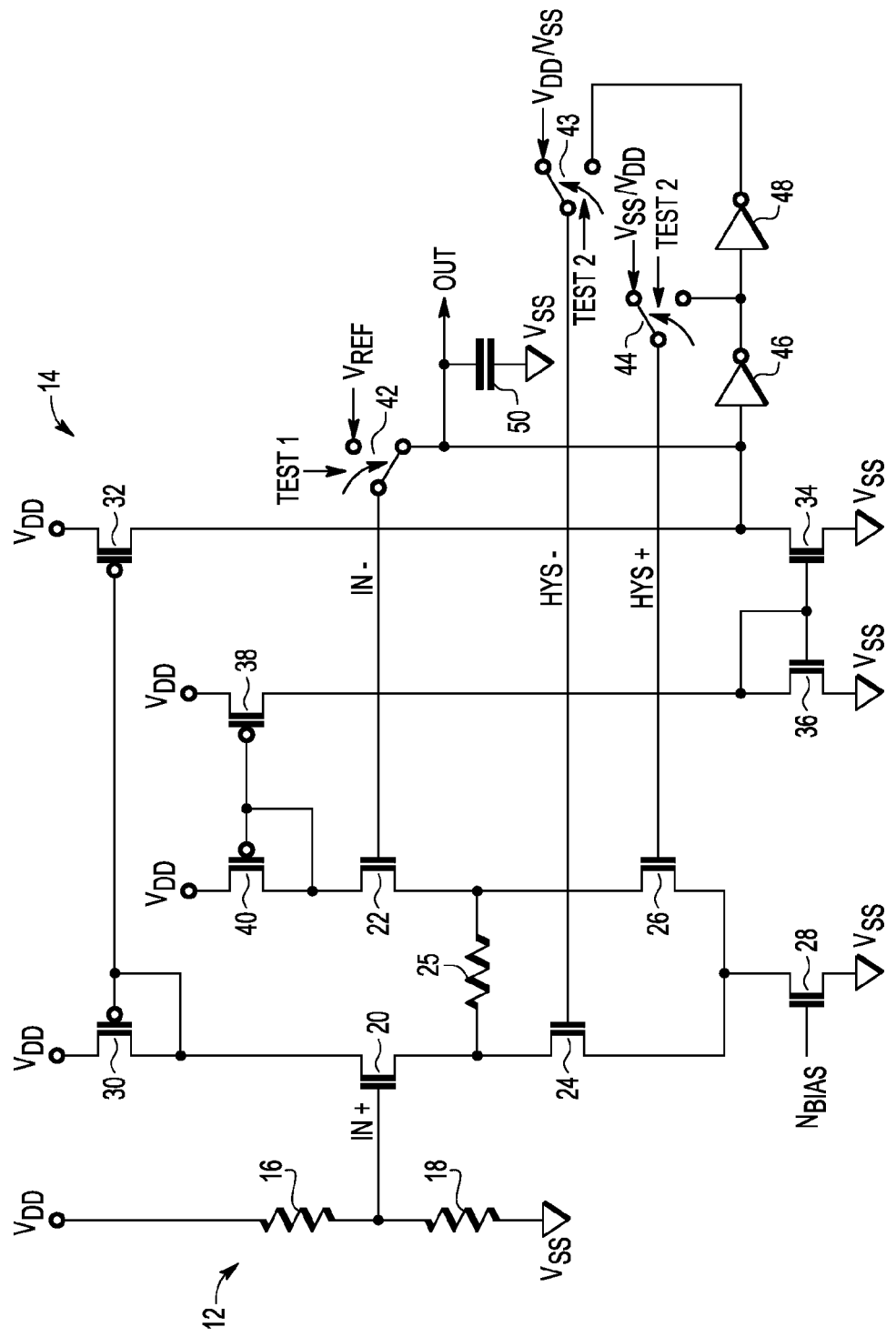
FIG. 2 illustrates the comparator of FIG. 1 reconfigured for testing.

FIG. 2 illustrates comparator 10 of FIG. 1 reconfigured as an amplifier for testing hysteresis threshold voltages. As illustrated in FIG. 2, signals TEST1 and TEST2 are provided to cause switch 42 to connect the gate of transistor 22 to receive output OUT, to cause switch 43 to connect the gate of hysteresis transistor 24 to receive either one of power supply voltages VDD and VSS, and to cause switch 44 to connect the gate of hysteresis transistor 26 to receive either one of VDD and VSS. Note that in accordance with an embodiment, depending on the state of signal TEST2, when transistor 24 is receiving VDD, transistor 26 is receiving VSS, and when transistor 24 is receiving VSS, transistor 26 is receiving VDD.

Figure 3:
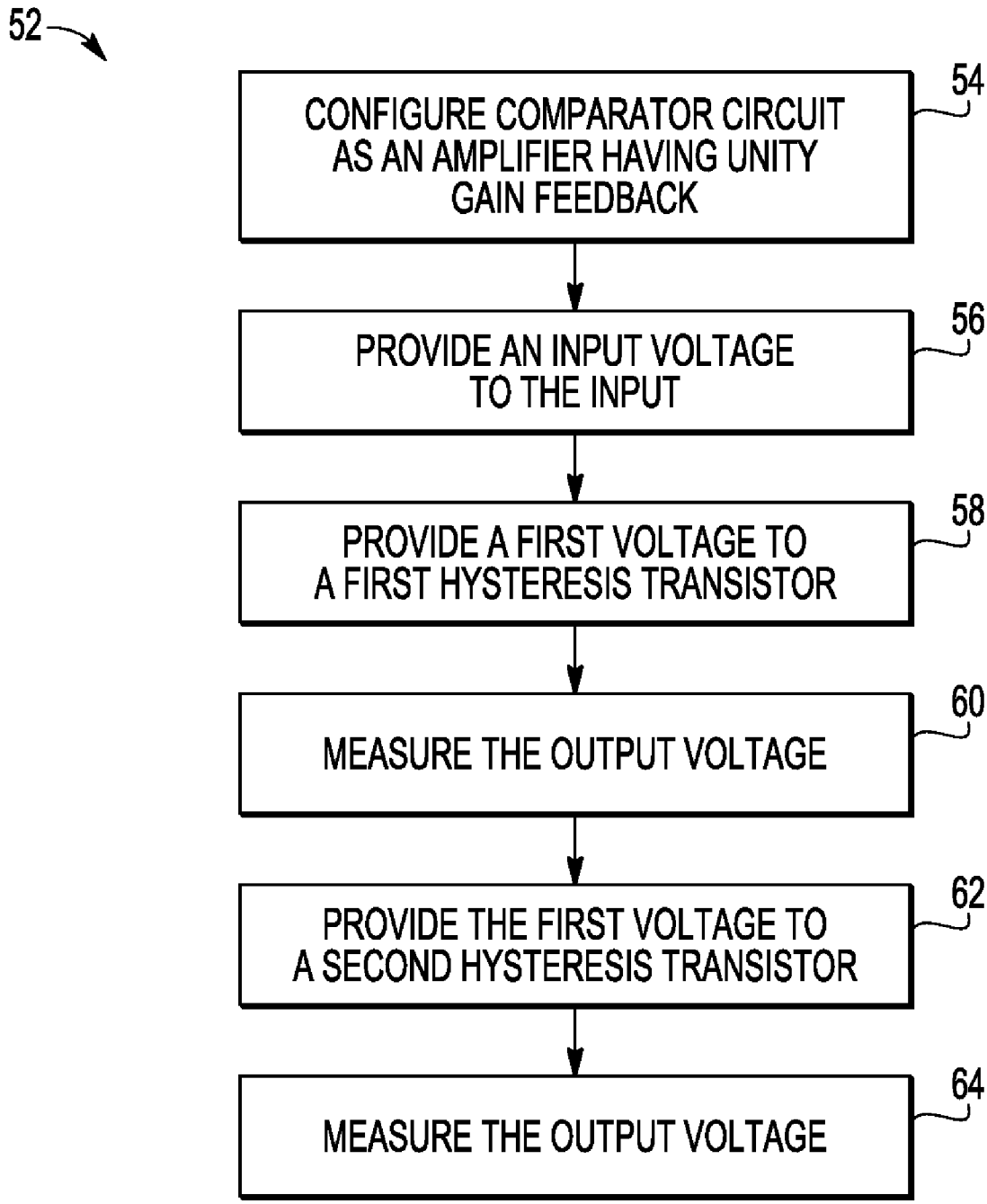
FIG. 3 illustrates a flow chart of a test method of the comparator as configured in FIG. 2.

FIG. 3 illustrates a flow chart of test method 52 of comparator 10 as configured in FIG. 2. The amplifier is powered up by applying power supply voltage VDD. At step 54, comparator 10 is reconfigured as an amplifier having unity gain feedback by asserting control signals TEST1 and TEST2. A high or low voltage offset is applied by supplying one of VDD or VSS to the gates of hysteresis transistors 24 and 26. In the illustrated embodiment, reconfiguring comparator 10 includes decoupling the gate of hysteresis transistor 24 from the output of inverter 48, decoupling the gate of hysteresis transistor 26 from the output of inverter 46, and coupling the gate of input transistor 22 to output OUT. In another embodiment having a different type of comparator, the step of reconfiguring will be different. At step 56, voltage divider 12 provides input voltage IN+ to the gate of transistor 20. In another embodiment, input voltage IN+ can be provided from another voltage source. Instead of receiving reference voltage VREF, the gate of transistor 22 is connected to output OUT in a feedback arrangement. At step 58, power supply voltage VDD is provided to the gate of hysteresis transistor 24. At the same time, the gate of hysteresis transistor 26 is coupled to ground, or zero volts. An offset voltage at output OUT will correlate to the high hysteresis threshold voltage of comparator 10 when comparator 10 is configured to operate as a comparator. At step 60, the low hysteresis threshold voltage is measured at output OUT. At step 62, power supply voltage VDD is provided to the gate of hysteresis transistor 26 while the gate of hysteresis transistor 24 is coupled to ground. As configured, the offset voltage at output OUT will correlate to the high hysteresis threshold voltage. At step 64, the high hysteresis threshold voltage OUT is measured.

By testing comparator 10 in this manner, time is saved because the input voltage IN+ does not have to be ramped up and then down to determine the high and low hysteresis threshold voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. In a comparator having a first input, a second input, an output, a first hysteresis transistor having a control electrode coupled to the output, and a second hysteresis transistor having a control electrode coupled to the output, a method for testing the comparator, the method comprising:
    reconfiguring the comparator to be an amplifier with unity gain feedback;
    providing an input voltage to the first input;
    providing a first voltage to the first hysteresis transistor to provide a first offset voltage;
    measuring a first output voltage at the output;
    removing the first voltage from the first hysteresis transistor;
    providing the first voltage to the second hysteresis transistor; and
    measuring a second output voltage at the output.

2. The method of claim 1, wherein reconfiguring the comparator further comprises:
    decoupling the control electrode of the first hysteresis transistor from the output;
    decoupling the control electrode of the second hysteresis transistor from the output; and
    coupling the second input to the output.

3. The method of claim 1, wherein providing the first voltage to the first hysteresis transistor further comprises providing a second voltage to the second hysteresis transistor, wherein the second voltage is different than the first voltage.

4. The method of claim 3, wherein the first voltage is characterized as being a positive power supply voltage and the second voltage is zero volts.

5. The method of claim 1, wherein providing the first voltage to the second hysteresis transistor further comprises providing a second voltage to the first hysteresis transistor, wherein the second voltage is different than the first voltage.

6. The method of claim 1, wherein providing the input voltage to the input further comprises providing the input voltage from a voltage divider coupled between first and second power supply voltage terminals.

7. The method of claim 6, wherein the comparator is used in a power-on-reset application.

8. The method of claim 1, further comprising coupling a compensation capacitor between the output and ground.

9. In a comparator circuit having a first input transistor having a control electrode for receiving an input voltage, a second input transistor having a control electrode for receiving a reference voltage, a current mirror having an input coupled to a second current electrode of the first input transistor, the current mirror having an output, a first hysteresis transistor having a first current electrode coupled to a first current electrode of the first input transistor, a second hysteresis transistor having a first current electrode coupled to a first current electrode of the second input transistor, a control electrode of each of the first and second hysteresis transistors selectively coupled to the output, a method for testing the comparator, the method comprising:
    decoupling the control electrodes of the first and second hysteresis transistors from the output;
    coupling the control electrode of the second input transistor to the output of the current mirror;
    providing a first power supply voltage to the control electrode of the first hysteresis transistor;
    providing a second power supply voltage to the control electrode of the second hysteresis transistor, the second power supply voltage being different than the first power supply voltage;
    providing an input voltage to the control electrode of the first input transistor;
    measuring a first output voltage at the output of the current mirror;
    providing the second power supply voltage to the control electrode of the first hysteresis transistor;
    providing the first power supply voltage to the control electrode of the second hysteresis transistor; and
    measuring a second output voltage at the output of the current mirror.

10. The method of claim 9, wherein the comparator is used in a power-on-reset circuit.

11. The method of claim 9, wherein the first power supply voltage is a positive power supply voltage and the second power supply voltage is zero volts.

12. The method of claim 9, wherein measuring the first output voltage further comprises measuring a high hysteresis threshold voltage of the comparator, wherein measuring the second output voltage further comprises measuring a low hysteresis threshold voltage of the comparator.

13. The method of claim 9, further comprising coupling a compensation capacitor between the output of the current mirror and a power supply voltage terminal.

14. The method of claim 9, wherein providing the input voltage to the control electrode of the first input transistor further comprises providing the input voltage from a voltage divider coupled between first and second power supply voltage terminals.

15. A comparator comprising:
a first input transistor having a first current electrode, a second current electrode, and a control electrode for receiving a first input voltage;
a second input transistor having first current electrode, a second current electrode, and a control electrode for receiving a second input voltage;
a current mirror having an input terminal coupled to the first current electrode of the first input transistor, and an output terminal;
a first hysteresis transistor having a first current electrode coupled to the second current electrode of the first input transistor, a second current electrode, and a control electrode;
a second hysteresis transistor having a first current electrode coupled to the second current electrode of the second input transistor, a second current electrode, and a control electrode;
a first switch having a first terminal coupled to the control electrode of the second input transistor, and a second terminal coupled to the output terminal of the current mirror;
a second switch coupled between the control electrode of the first hysteresis transistor and one of either a power supply voltage or a first output voltage from the current mirror; and
a third switch coupled between the control electrode of the second hysteresis transistor and one of either the power supply voltage or a second output voltage from the current mirror.

16. The comparator of claim 15, further comprising a resistive element having a first terminal coupled to the second current electrode of the first input transistor and a second terminal coupled to the second current electrode of the second input transistor.

17. The comparator of claim 15, further comprising a voltage divider coupled to the control electrode of the first input transistor for providing the first input voltage.

18. The comparator of claim 15, further comprising an inverter coupled between the output terminal of the current mirror and a terminal of the third switch.

19. The comparator of claim 15, further comprising a current source having a first terminal coupled to the second current electrodes of the first and second hysteresis transistors, and a second terminal coupled to a power supply voltage terminal.

20. The comparator of claim 15, wherein the current mirror comprises:
a first transistor having a first current electrode coupled to a first power supply voltage terminal, and a control electrode and a second current electrode both coupled to the first current electrode of the first input transistor;
a second transistor having a first current electrode coupled to the first power supply voltage terminal, a second current electrode, and a control electrode coupled to the first current electrode of the first input transistor;
a third transistor having a first current electrode coupled to the second current electrode of the second transistor, a second current electrode coupled to a second power supply voltage terminal, and a control electrode;
a fourth transistor having a first current electrode and control electrode both coupled to the control electrode of the third transistor, and a second current electrode coupled to the second power supply voltage terminal;
a fifth transistor having a first current electrode coupled to the first power supply voltage terminal, a control electrode coupled to the first current electrode of the second input transistor, and a second current electrode coupled to the first current electrode of the fourth transistor; and
a sixth transistor having a first current electrode coupled to the first power supply voltage terminal, a control electrode and a second current electrode both coupled to the first current electrode of the second input transistor.

* * * * *